United States Patent
Mistretta et al.

(10) Patent No.: US 7,917,190 B2
(45) Date of Patent: *Mar. 29, 2011

(54) IMAGE ACQUISITION AND RECONSTRUCTION METHOD FOR FUNCTIONAL MAGNETIC RESONANCE IMAGING

(75) Inventors: Charles A. Mistretta, Madison, WI (US); Walter F. Block, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1162 days.

This patent is subject to a terminal disclaimer.

(21) Appl. No.: 11/524,571

(22) Filed: Sep. 21, 2006

(65) Prior Publication Data

US 2007/0167728 A1 Jul. 19, 2007

Related U.S. Application Data

(60) Provisional application No. 60/719,445, filed on Sep. 22, 2005, provisional application No. 60/738,442, filed on Nov. 21, 2005.

(51) Int. Cl.
*A61B 5/05* (2006.01)
*G01V 3/00* (2006.01)
(52) U.S. Cl. ........................ 600/410; 324/307
(58) Field of Classification Search .................. 600/407, 600/410; 324/314; 378/4; 382/128–133, 382/294

See application file for complete search history.

(56) References Cited

U.S. PATENT DOCUMENTS

| | | | |
|---|---|---|---|
| 5,502,385 | A | 3/1996 | Kuhn et al. |
| 5,603,322 | A | 2/1997 | Jesmanowicz et al. |
| 5,604,778 | A | 2/1997 | Polacin et al. |
| 5,933,006 | A | 8/1999 | Rasche et al. |
| 6,490,472 | B1 | 12/2002 | Li et al. |
| 6,807,248 | B2 | 10/2004 | Mihara et al. |
| 6,954,067 | B2 | 10/2005 | Mistretta |
| 2001/0027262 | A1 | 10/2001 | Mistretta et al. |

FOREIGN PATENT DOCUMENTS

| | | |
|---|---|---|
| EP | 0 627 633 A1 | 12/1994 |
| WO | WO 2005/026765 | 3/2005 |
| WO | WO 2005/069031 | 7/2005 |

OTHER PUBLICATIONS

Wieslaw L. Nowinski, The Iterated Normalized Backprojection Method of Image Reconstruction, Institute of Computer Science, Polish Academy of Sciences Ordona 21, 01-237 Warsaw, Poland.
Y. Huang et al, Time-Resolved 3D MR Angiography by Interleaved Biplane Projection, Proc. Intl. Soc. Mag. Reson. Med. 13 (2005).
T.A. Cashen et al, Comparison of Temporal and Spatial Undersampling Techniques for Time-Resolved Contrast-Enhanced MR Angiography, Proc. Intl. Soc. Mag. Reson. Med. 13, (2005).

(Continued)

*Primary Examiner* — Long V Le
*Assistant Examiner* — Michael T Rozanski
(74) *Attorney, Agent, or Firm* — Quarles & Brady LLP

(57) ABSTRACT

Acquisition of MR data during a fMRI study employs a hybrid PR pulse sequence to acquire projection views from which multi-slice image frames may be reconstructed that depict the BOLD response to an applied stimulus or performed task. Composite images are reconstructed at each slice using the combined interleaved projection views from all the acquired image frames. The composite images are used to reconstruct the highly undersampled image frames.

12 Claims, 12 Drawing Sheets

OTHER PUBLICATIONS

Graeme C. McKinnon et al, Towards Imaging the Beating Heart Usefully with a Conventional CT Scanner, Trans. on Biomedical Eng., vol. BME-28, No. 2, p. 123-127, Feb. 1981.

Kathryn L. Garden et al, 3-D Reconstruction of the Heart from few Projections: A Practical Implementation of the McKinnon-Bates Algorithm, Trans. on Biomedical Eng., vol. MI-5, No. 4, p. 233-234, Dec. 1986.

A.L. Wentland et al, Technique for Acquiring MR Image of CSF Flow During a Valsalva Maneuver, Med. Phys. Univ. of WI, Madison WI.

K.M. Johnson et al, Average and Time-Resolved Dual Velocity Encoded Phase Contrast Vastly Undersampled Isotropic Projection Imaging, Med. Phys. Univ. of WI, Madison WI.

K.M. Johnson et al, Transtenotic Pressure Gradient Measurements Using Phase Contrast Vastly Undersampled Isotropic Projection Imaging (PC-VIPR) in a Canin Model, Med. Phys. Univ. of WI, Madison WI.

C.A. Mistretta et al, Highly Constrained Backprojection for Time-Resolved MRI, Mag. Reson. Med. 55:30-40 (2006).

Zhi-Pei Liang et al, Constrained Reconstruction Methods in MR Imaging, Reviews of Mag. Reson. in Med. vol. 4, pp. 67-185, 1992.

J.G. Pipe et al, Spiral Projection Imaging: a new fast 3D trajectory, Proc. Intl. Soc. Mag. Reson. Med. 13, (2005).

K.V. Koladia et al, Rapid 3D PC-MRA using Spiral Projection Imaging, Proc. Intl. Soc. Mag. Reson. Med. 13, (2005).

J. Tsao et al, k-t BLAST and k-t SENSE: Dynamic MRI With High Frame Rate Exploiting Spatiotemporal Correlations, Mag. Reson. Med. 50:1031-1042 (2003).

Zhi-Pei Liang et al, Constrained Imaging-Overcoming the Limitations of the Fourier Series, IEEE Engineering in Medicine and Biology, Sep./Oct. 1996, pp. 126-132.

Zhi-Pei Liang et al, Fast Algorithm for GS-Model-Based Image Reconstruction in Data-Sharing Fourier Imaging, IEEE Transactions on Med. Imaging, vol. 22, No. 8, pp. 1026-1030, Aug. 2003.

Klass P. Pruessmann et al, Advances in Sensitivity Encoding With Arbitrary k-Space Trajectories, Mag. Reson. in Med. 46:638-651 (2001).

R. Fahrig et al, Use of a C-Arm System to Generate True Three-dimensional Computed Rotational Angiograms: Preliminary In Vitro and In Vivo Results, AJNR: 18, pp. 1507-1514, Sep. 1997.

A.V. Barger, et al, Single Breath-Hold 3D Contrast-Enhanced Method for Assessment of Cardiac Function, Mag. Reson. in Med. 44:821-824 (2000).

J. Du et al, Time-Resolved Undersampled Projection Reconstruction Imaging for High-Resolution CE-MRA of the Distal Runoff Vessels, Mag. Reson. in Med. 48:516-522 (2002).

Ashwani Aggarwal et al, Imaging In Turbid Media by Modified Filtered Back Projection Method Using Data From Monte Carlo Simulation, Proc. of SPIE vol. 5047, pp. 314-324.

Xavier Golay, et al, Presto-Sense: An Ultrafast Whole-Brain fMRI Technique, Mag. Reson. in Med. 43:779-786 (2000).

Ronald R. Price, et al, Practical Aspects of Functional MRI (NMR Task Group #6), Medical Physics, vol. 29, No. 8, pp. 1892-1912, Aug. 2002.

M.S. Hansen et al, k-t Blast Reconstruction From Arbitrary k-t space Sampling: Application To Dynamic Radial Imaging, Proc. Intl. Soc. Mag. Reson. Med. 13 p. 684 (2005).

US 7,917,190 B2

IMAGE ACQUISITION AND RECONSTRUCTION METHOD FOR FUNCTIONAL MAGNETIC RESONANCE IMAGING

CROSS-REFERENCE TO RELATED APPLICATIONS

This application is based on U.S. Provisional Patent Application Ser. Nos. 60/719,445 filed on Sep. 22, 2005 and entitled "HIGHLY CONSTRAINED IMAGE RECONSTRUCTION METHOD"; and 60/738,442 filed on Nov. 21, 2005 and entitled "IMAGE ACQUISITION AND RECONSTRUCTION METHOD FOR FUNCTIONAL MAGNETIC RESONANCE IMAGING."

STATEMENT REGARDING FEDERALLY SPONSORED RESEARCH

This invention was made with government support under Grant Numbers HL072260, HL066488, and EB002 awarded by the National Institute of Health. The United States Government has certain rights in this invention.

BACKGROUND OF THE INVENTION

The field of the invention is nuclear magnetic resonance imaging methods and systems. More particularly, the invention relates to the acquisition and reconstruction of functional magnetic resonance images (fMRI).

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. Each measurement is referred to in the art as a "view" and the number of views determines the quality of the image. The resulting set of received NMR signals, or views, or k-space samples, are digitized and processed to reconstruct the image using one of many well known reconstruction techniques. The total scan time is determined in part by the number of measurement cycles, or views, that are acquired for an image, and therefore, scan time can be reduced at the expense of image quality by reducing the number of acquired views.

The most prevalent method for acquiring an NMR data set from which an image can be reconstructed is referred to as the "Fourier transform" imaging technique or "spin-warp" technique. This technique is discussed in an article entitled "Spin-Warp NMR Imaging and Applications to Human Whole-Body Imaging", by W. A. Edelstein et al., *Physics in Medicine and Biology*, Vol. 25, p. 751-756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($G_{y_i}$) in the sequence of views that are acquired during the scan. In a three-dimensional implementation (3DFT) a third gradient ($G_z$) is applied before each signal readout to phase encode along the third axis. The magnitude of this second phase encoding gradient pulse $G_z$ is also stepped through values during the scan. These 2DFT and 3DFT methods sample k-space in a rectilinear pattern as shown in FIG. 2 and the k-space samples lie on a Cartesian grid.

More recently projection reconstruction methods have been used for acquiring time-resolved data as disclosed in U.S. Pat. No. 6,487,435. Projection reconstruction methods, sometimes referred to as "radial" acquisitions, have been known since the inception of magnetic resonance imaging. Rather than sampling k-space in a rectilinear scan pattern as is done in Fourier imaging and shown in FIG. 2, projection reconstruction methods acquire a series of views that sample radial lines extending outward from the center of k-space as shown in FIG. 3. The number of views needed to sample k-space determines the length of the scan and if an insufficient number of views are acquired, streak artifacts are produced in the reconstructed image. The technique disclosed in U.S. Pat. No. 6,487,435 reduces such streaking by acquiring successive undersampled images with interleaved views and sharing peripheral k-space data between successive images.

There are two methods used to reconstruct images from an acquired set of k-space projection views as described, for example, in U.S. Pat. No. 6,710,686. The most common method is to regrid the k-space samples from their locations on the radial sampling trajectories to a Cartesian grid. The image is then reconstructed by performing a 2D or 3D Fourier transformation of the regridded k-space samples. The second method for reconstructing an image is to transform the radial k-space projection views to Radon space by Fourier transforming each projection view. An image is reconstructed from these signal projections by filtering and backprojecting them into the field of view (FOV). As is well known in the art, if the acquired signal projections are insufficient in number to satisfy the Nyquist sampling theorem, streak artifacts are produced in the reconstructed image.

The standard backprojection method is illustrated in FIG. 4. Each acquired signal projection profile 10 is backprojected onto the field of view 12 by projecting each signal sample 14 in the profile 10 through the FOV 12 along the projection path as indicted by arrows 16. In projecting each signal sample 14 in the FOV 12 we have no a priori knowledge of the subject and the assumption is made that the NMR signals in the FOV 12 are homogeneous and that the signal sample 14 should be distributed equally in each pixel through which the projection path passes. For example, a projection path 8 is illustrated in FIG. 4 for a single signal sample 14 in one signal projection profile 10 as it passes through N pixels in the FOV 12. The signal value (P) of this signal sample 14 is divided up equally between these N pixels:

$$S_n = (P \times 1)/N \qquad (1)$$

where: $S_n$ is the NMR signal value distributed to the $n^{th}$ pixel in a projection path having N pixels.

Clearly, the assumption that the NMR signal in the FOV 12 is homogeneous is not correct. However, as is well known in the art, if certain filtering corrections are made to each signal profile 10 and a sufficient number of filtered profiles are acquired at a corresponding number of projection angles, the errors caused by this faulty assumption are minimized and image artifacts are suppressed. In a typical, filtered backprojection method of image reconstruction, 400 projections are required for a 256×256 pixel 2D image and 203,000 projections are required for a 256×256×256 voxel 3D image. If the method described in the above-cited U.S. Pat. No. 6,487,435 is employed, the number of projection views needed for these same images can be reduced to 100 (2D) and 2000 (3D).

Functional magnetic resonance imaging (fMRI) technology provides a new approach to study neuronal activity. Conventional fMRI detects changes in cerebral blood volume, flow, and oxygenation that locally occur in association with increased neuronal activity induced by functional paradigms. As described in U.S. Pat. No. 5,603,322, an MRI system is used to acquire signals from the brain over a period of time. As the brain performs a task, these signals are modulated synchronously with task performance to reveal which regions of the brain are involved in performing the task.

The series of fMRI time course images must be acquired at a rate that is high enough to see the changes in brain activity induced by the functional paradigm. In addition, because neuronal activity may occur at widely dispersed locations in the brain, a relatively large 3D volume or multi-slice volume must be acquired in each time frame. Currently, single shot EPI pulse sequences are commonly used for acquiring fMRI time course data. Using such a pulse sequence, for example, fifteen 8 mm thick, 64×64 pixel slices may be acquire at a frame rate of 0.5 fps. It is desirable to both increase image resolution and the frame rate of fMRI images.

SUMMARY OF THE INVENTION

The present invention is a method for acquiring and reconstructing fMRI images in which highly undersampled image frames are acquired from a subject's brain following application of a stimulus or start of a task. Views in the image frames are interleaved and combined to form a composite image that is employed during a highly constrained reconstruction of each image frame to increase signal to notice ratio ("SNR") and reduce artifacts.

A discovery of the present invention is that good quality image frames can be produced with far fewer acquired views if a priori knowledge of the NMR signal contour in the FOV 12 is used in the backprojection image reconstruction process instead of the assumed homogeneous signal contour. Referring to FIG. 5, for example, the signal contour in the FOV 12 may be known to include structures such as blood vessels 18 and 20. That being the case, when the backprojection path 8 passes through these structures a more accurate distribution of the signal sample 14 in each pixel is achieved by weighting the distribution as a function of the known NMR signal contour at that pixel location. As a result, a majority of the signal sample 14 will be distributed at the pixels that intersect the structures 18 and 20. For a backprojection path 8 having N pixels this may be expressed as follows:

$$S_n = (P \times C_n) / \sum_{n=1}^{N} C_n \qquad (2)$$

where: P=the NMR signal sample value; and

Cn=signal value of the composite image at the nth pixel along the backprojection path.

The numerator in equation (2) weights each pixel using the corresponding NMR signal value in the composite image and the denominator normalizes the value so that all backprojected signal samples reflect the projection sums for the image frame and are not multiplied by the sum of the composite image. It should be noted that while the normalization can be performed on each pixel separately after the backprojection is performed, in many clinical applications it is far easier to normalize the projection P before the backprojection. In this case, the projection P is normalized by dividing by the corresponding value $P_c$ in a projection through the composite image at the same view angle. The normalized projections $P/P_c$ are then backprojected and the resulting image is then multiplied by the composite image.

A 3D embodiment of the invention is shown graphically in FIG. 6 for a single 3D projection view characterized by the view angles θ and φ. This projection view is Fourier transformed to form a signal contour and it is back projected along axis 16 and spread into a Radon plane 21 at a distance r along the back projection axis 16. Instead of a filtered back projection in which projection signal contour values are filtered and uniformly distributed into the successive Radon planes, along axis 16, the projection signal contour values are distributed in the Radon plane 21 using the information in the composite image. The composite image in FIG. 6 contains vessels 18 and 20. The weighted signal contour value is deposited at image location x, y, z in the Radon plane 21 based on the intensity at the corresponding location x, y, z in the composite image. This is a simple multiplication of the signal profile value by the corresponding composite image voxel value. This product is then normalized by dividing the product by the profile value from the corresponding image space profile formed from the composite image. The formula for the 3D reconstruction is $$I(x,y,z) = \Sigma(P(r,\theta,\phi) * C(x,y,z)_{(r,\theta,\phi)} / P_c(r,\theta,\phi)) \qquad (3)$$

where the sum (Σ) is over all projections in the time frame and the x, y, z values in a particular Radon plane are calculated using the profile value P(r,θ,φ) at the appropriate r,θ,φ value for that plane. $P_c(r,\theta,\phi)$ is the corresponding profile value from the composite image and $C(x,y,z)_{r,\theta,\phi}$ is the composite image value at (r,θ,φ).

Another discovery of the present invention is that this image reconstruction method can be advantageously employed in fMRI procedures in which a series of undersampled frame images are acquired as a stimulus is applied to the subject or the subject is directed to perform a specific task. By interleaving the views of the successive image frame acquisitions, views from successive image frames can be combined and used to reconstruct a higher quality composite image. This composite image is then used in the above described highly constrained backprojection reconstruction of each image frame.

Another aspect of the present invention is the reconstruction of image frames acquired during a fMRI scan with a 3D hybrid projection reconstruction pulse sequence. Projection views are acquired to sample k-space with radial trajectories in a 2D slice and phase encoding is employed to acquire multiple slices along an axial direction. A composite image is reconstructed for each of the multiple slice locations and these composite images are employed during the backprojection reconstruction of the 2D slices in each image frame.

DETAILED DESCRIPTION OF THE PREFERRED EMBODIMENT

Figure 1:
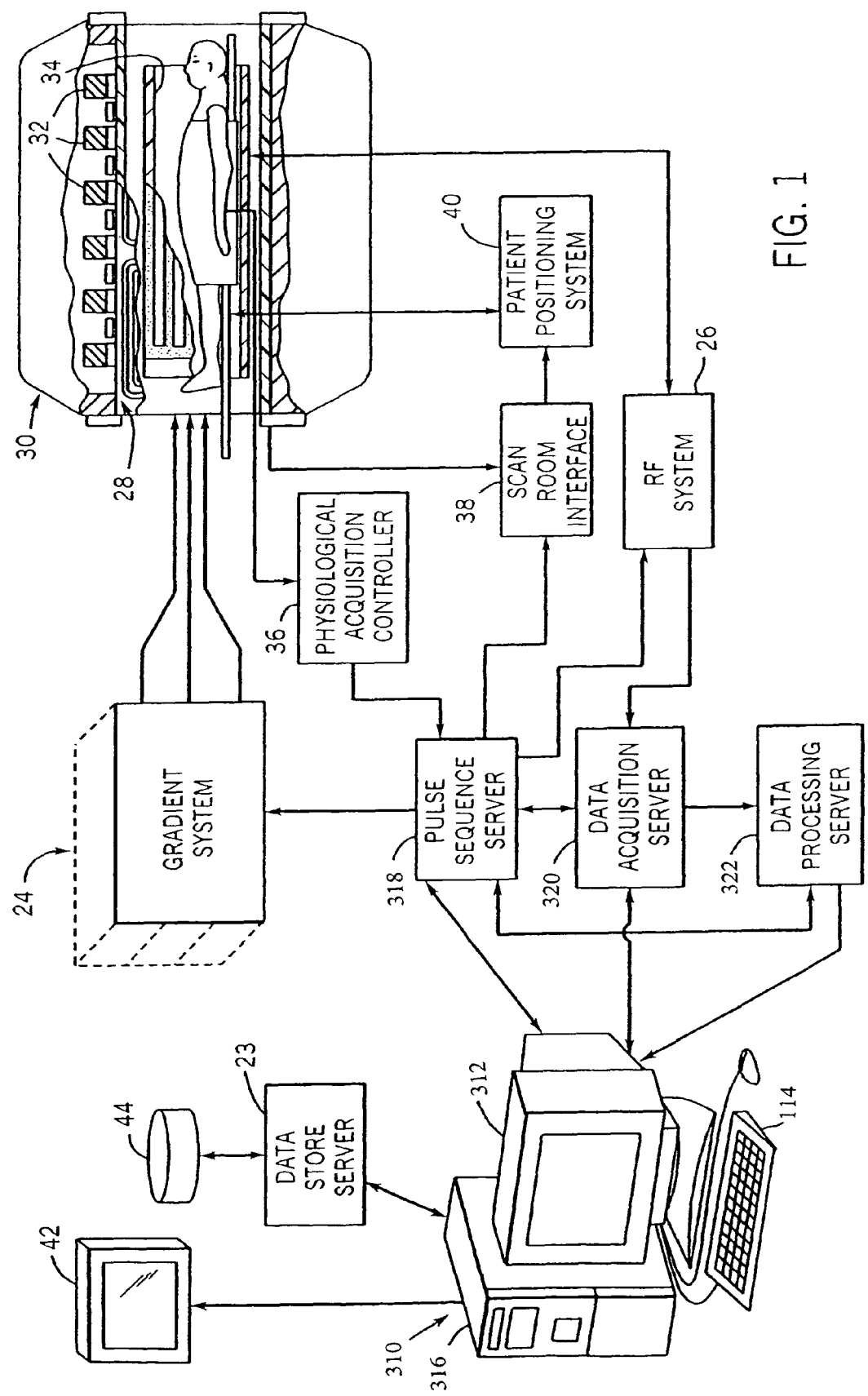
FIG. 1 is a block diagram of an MRI system which employs the present invention.
Figure 2:
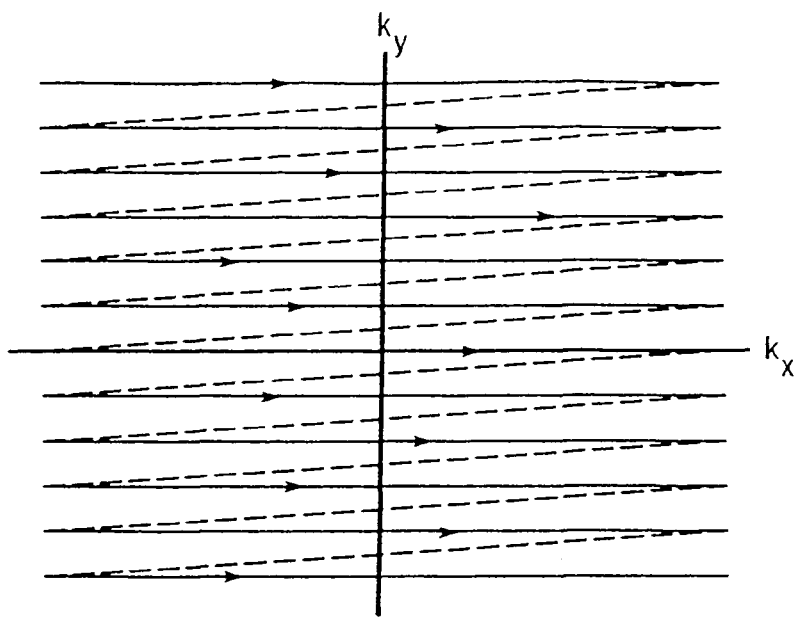
FIG. 2 is a pictorial representation of k-space sampling using a Fourier transform technique.
Figure 3:
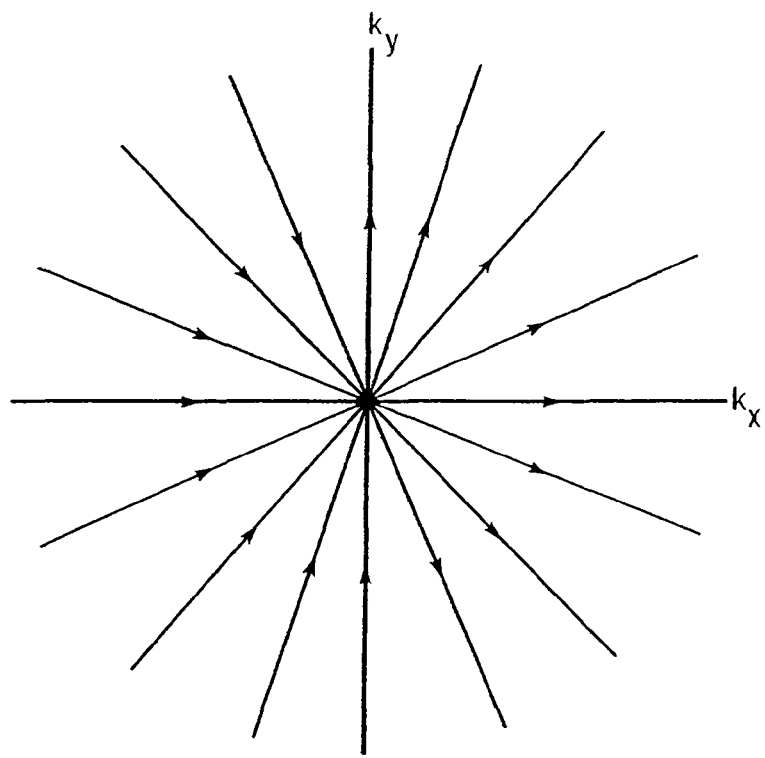
FIG. 3 is a pictorial representation of k-space sampling using a projection reconstruction technique.
Figure 4:
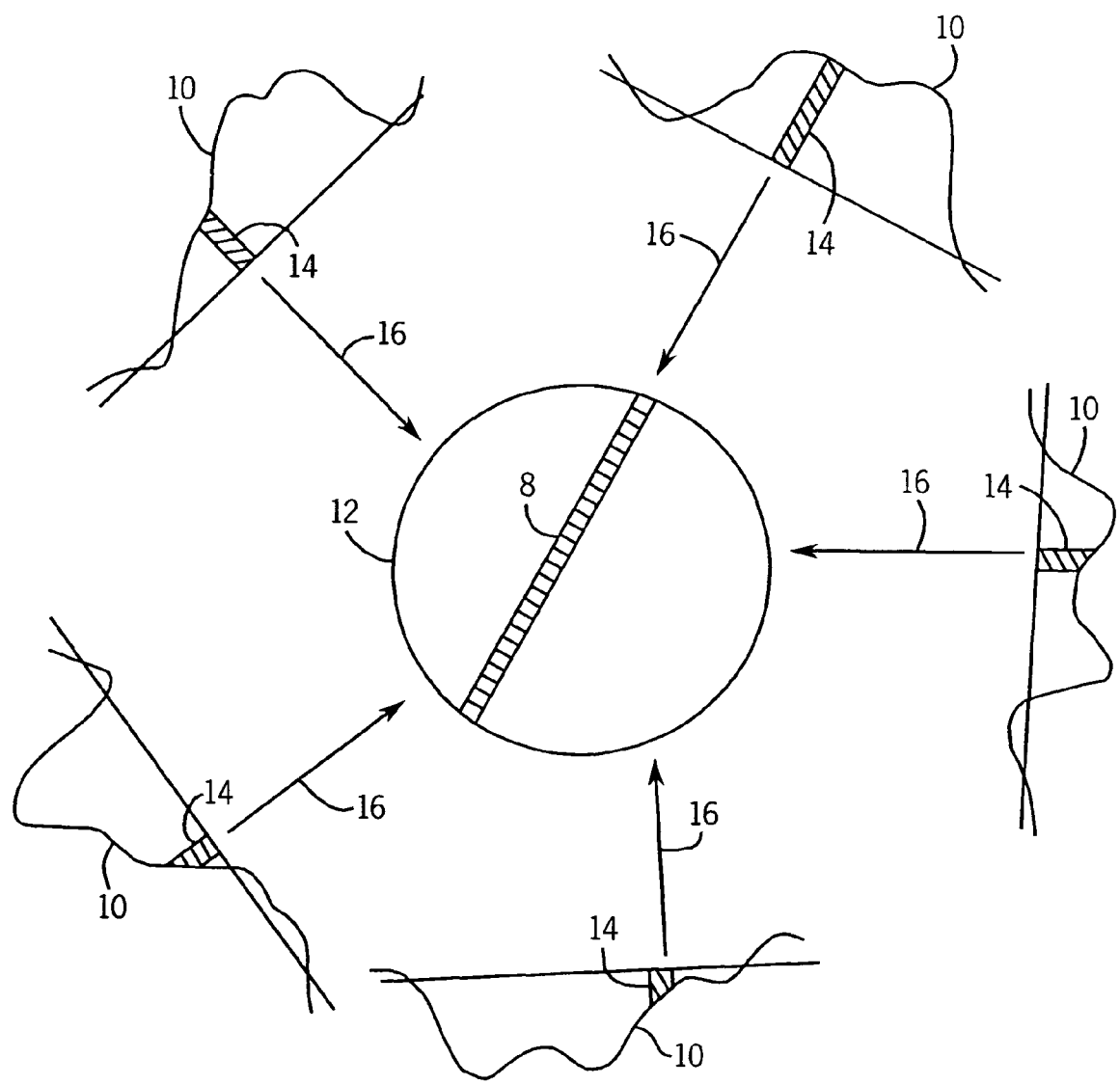
FIG. 4 is a pictorial representation of a conventional backprojection reconstruction method.

Referring particularly to FIG. 1, the preferred embodiment of the invention is employed in an MRI system. The MRI system includes a workstation 310 having a display 312 and a keyboard 314. The workstation 310 includes a processor 316 which is a commercially available programmable machine running a commercially available operating system. The workstation 310 provides the operator interface which enables scan prescriptions to be entered into the MRI system.

The workstation 310 is coupled to four servers: a pulse sequence server 318; a data acquisition server 320; a data processing server 322, and a data store server 23. In the preferred embodiment the data store server 23 is performed by the workstation processor 316 and associated disc drive interface circuitry. The remaining three servers 318, 320 and 322 are performed by separate processors mounted in a single enclosure and interconnected using a 64-bit backplane bus. The pulse sequence server 318 employs a commercially available microprocessor and a commercially available quad communication controller. The data acquisition server 320 and data processing server 322 both employ the same commercially available microprocessor and the data processing server 322 further includes one or more array processors based on commercially available parallel vector processors.

The workstation 310 and each processor for the servers 318, 320 and 322 are connected to a serial communications network. This serial network conveys data that is downloaded to the servers 318, 320 and 322 from the workstation 310 and it conveys tag data that is communicated between the servers and between the workstation and the servers. In addition, a high speed data link is provided between the data processing server 322 and the workstation 310 in order to convey image data to the data store server 23.

The pulse sequence server 318 functions in response to program elements downloaded from the workstation 310 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 318. The RF system 26 includes an RF transmitter for producing a wide variety of RF pulses used in MR pulse sequences. The RF transmitter is responsive to the scan prescription and direction from the pulse sequence server 318 to produce RF pulses of the desired frequency, phase and pulse amplitude waveform. The generated RF pulses may be applied to the whole body RF coil 34, but in the preferred embodiment of the invention a local head coil such as that described in U.S. Pat. No. 5,372,137 is employed to both transmit the RF pulses and receive resulting NMR signals.

The RF system 26 also includes one or more RF receiver channels which may be connected to a corresponding plurality of local coils or to a corresponding plurality of coil elements in a coil array. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2-Q^2},$$

and the phase of the received NMR signal may also be determined:

$$\phi=\tan^{-1}Q/I.$$

As indicated above, a local head coil is employed to receive the NMR signal produced in a subject's brain in accordance with the preferred embodiment of the present invention.

The pulse sequence server 318 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 318 to synchronize, or "gate", the performance of the scan with the subject's respiration or heart beat.

The pulse sequence server 318 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 320. The data acquisition server 320 operates in response to description components downloaded from the workstation 310 to receive the real-time NMR data and provide buffer storage such that no data is lost by data overrun. In some scans the data acquisition server 320 does little more than pass the acquired NMR data to the data processor server 322. However, in scans which require information derived from acquired NMR data to control the further performance of the scan, the data acquisition server 320 is programmed to produce such information and convey it to the pulse sequence server 318. For example, during prescans NMR data is acquired and used to calibrate the pulse sequence performed by the pulse sequence server 318. Also, navigator signals may be acquired during a scan and used to adjust RF or gradient system operating parameters or to control the view order in which k-space is sampled. And, the data acquisition server 320 may be employed to process NMR signals used to detect the arrival of contrast agent in an MRA scan. In all these examples the data acquisition server 320 acquires NMR data and processes it in real-time to produce information which is used to control the scan.

The data processing server 322 receives NMR data from the data acquisition server 320 and processes it in accordance with description components downloaded from the workstation 310. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 322 are conveyed back to the workstation 310 where they are stored. Real-time images are stored in a data base memory cache (not shown) from which they may be output to operator display 312 or a display 42 which is located near the magnet assembly 30 for use by attending physicians. Batch mode images or selected real time images are stored in a host database on disc storage 44. When such images have been reconstructed and transferred to storage, the data processing server 322 notifies the data store server 23 on the workstation 310. The workstation 310 may be used by an operator to archive the images, produce films, or send the images via a network to other facilities.

Figure 7:
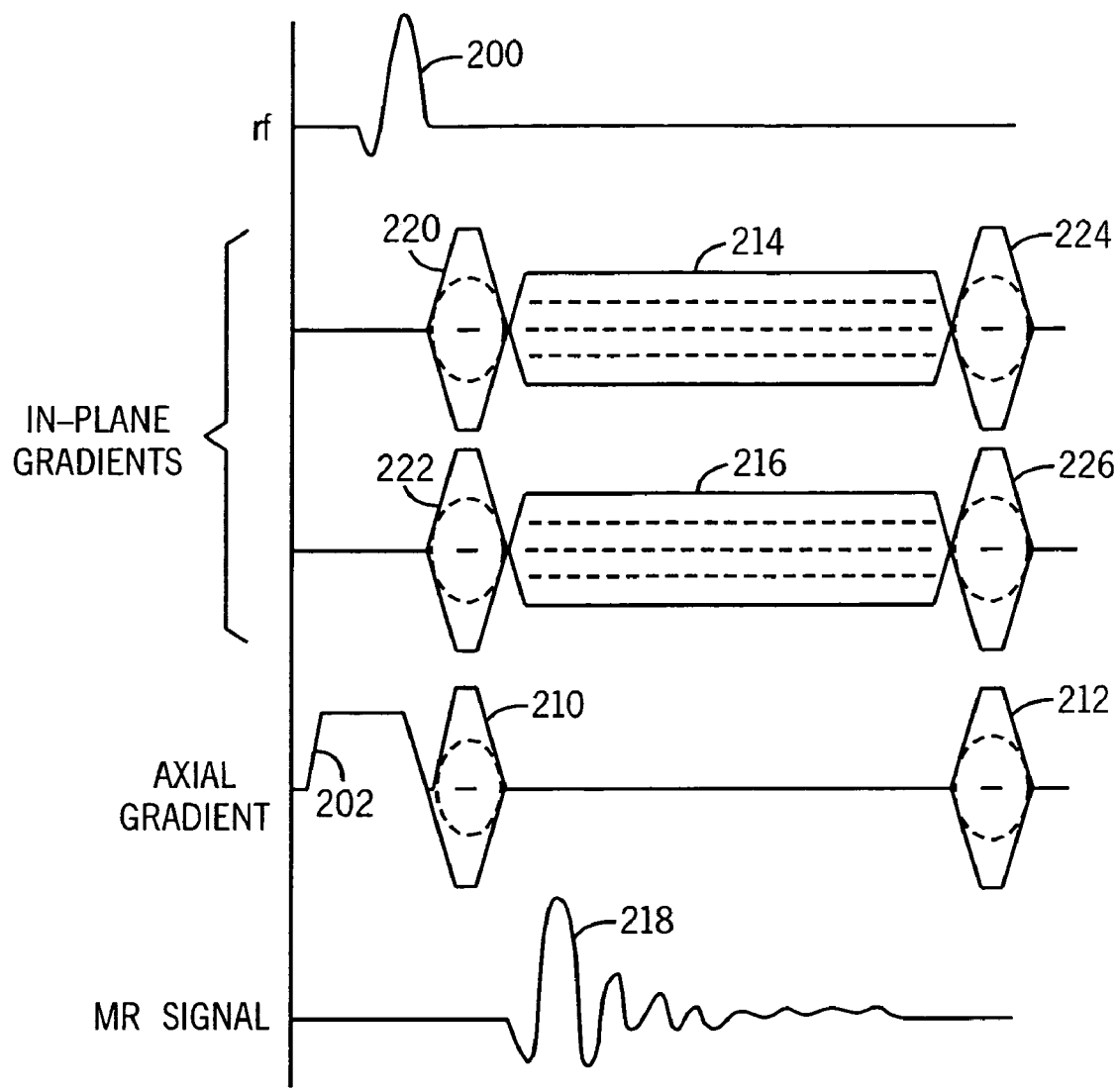
FIG. 7 is a graphic illustration of a hybrid PR pulse sequence performed by the MRI system of FIG. 1 when practicing the preferred embodiment of the present invention.

To practice the preferred embodiment of the invention NMR data is acquired using a projection reconstruction, or radial, pulse sequence shown in FIG. 7. This is a fast gradient-recalled echo pulse sequence in which a selective, asymmetrically truncated sinc rf excitation pulse 200 is produced in the presence of a slice-select gradient 202. The flip angle of the rf pulse 200 is set near the Ernst angle for blood.

Figure 8:
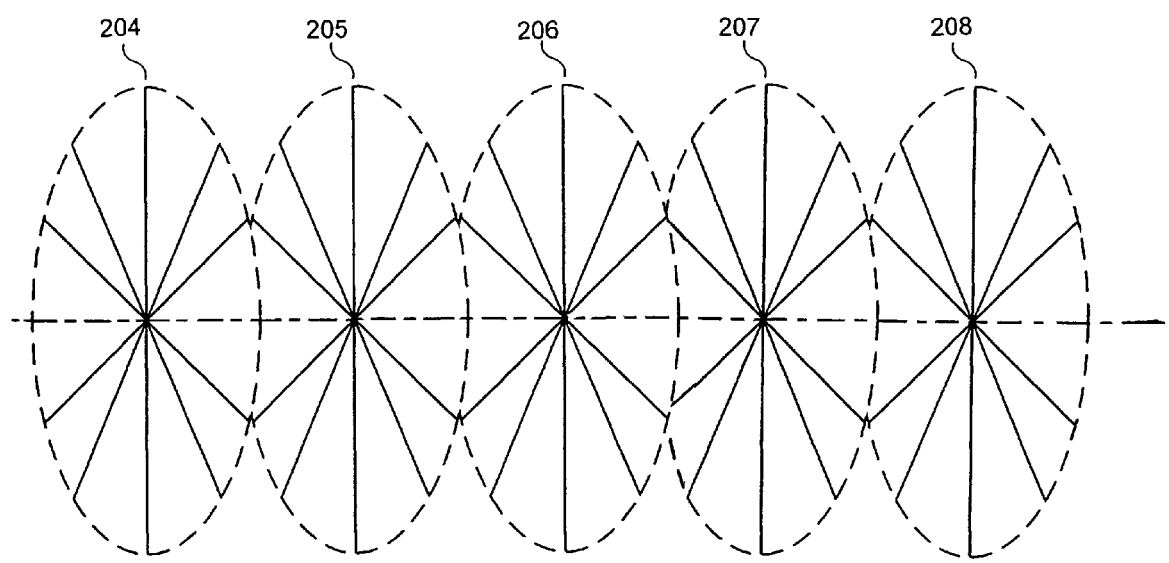
FIG. 8 is a pictorial representation of k-space sampling using the hybrid pulse sequence of FIG. 7.

As will be explained in more detail below, this pulse sequence may be used to acquire a plurality of circular k-space planes as shown at 204, 205, 206, 207 and 208 in FIG. 8. When multiple 2D slices are acquired the axial gradient 202 is a slab select gradient followed by a phase encoding gradient lobe 210 and a rewinder gradient lobe 212 of opposite polarity. This axial phase encoding gradient 210 is stepped through values during the scan to sample from each of the 2D k-space planes. In the preferred embodiment five k-space planes are sampled so that a corresponding five 2D slices may be reconstructed as described below.

Two in-plane readout gradients 214 and 216 are played out during the acquisition of an NMR echo signal 218 to sample k-space in a 2D plane 204, 205, 206, 207 or 208 along a radial trajectory. These in-plane gradients 214 and 216 are perpendicular to the axial gradient and they are perpendicular to each other. During a scan they are stepped through a series of values to rotate the view angle of the radial sampling trajectory as will be described in more detail below. Each of the in-plane readout gradients is preceded by a prephasing gradient lobe 220 and 222 and followed by a rewinder gradient lobe 224 and 226.

To obtain a strong $T^*_2$ weighting for BOLD signal contrast, a long TE is desired. Since a short TR is also desired to reduce scan time, an echo-shifted pulse sequence is employed in which the MR signal 218 that is acquired during any TR is produced by rf excitation in a previous TR. As is known in the art, such an echo shifting is achieved by adding a spoiler gradient after the excitation pulse 200 and prior to the signal readout gradients 214 and 216. The spoiler gradient lobe (not shown in the drawings) is added to the rephrasing lobe on the slice select gradient 202 in the preferred embodiment and its value changes in a pattern over a set of TRs such that a proper echo signal 218 refocuses two or three TRs after spin excitation. Reference is made to "Handbook of MRI Pulse Sequences" by Bernstein et al, published in 2004 by Elsevier Academic press for a more detailed description of this known echo shifting technique.

It should be apparent to those skilled in the art that sampling trajectories other than the preferred straight line trajectory extending from one point on the k-space peripheral boundary, through the center of k-space to an opposite point on the k-space peripheral boundary may be used. One variation is to acquire a partial NMR echo signal 218 which samples along a trajectory that does not extend across the entire extent of the sampled k-space volume. Another variation which is equivalent to the straight line projection reconstruction pulse sequence is to sample along a curved path rather than a straight line. Such pulse sequences are described, for example, in "Fast Three Dimensional Sodium Imaging", MRM, 37:706-715, 1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia. It should also be apparent that the present invention may be employed with 3D as well as 2D versions of these sampling methods and references to the term "pixel" as used hereinafter is intended to refer to a location in either a 2D or a 3D image.

Figure 9:
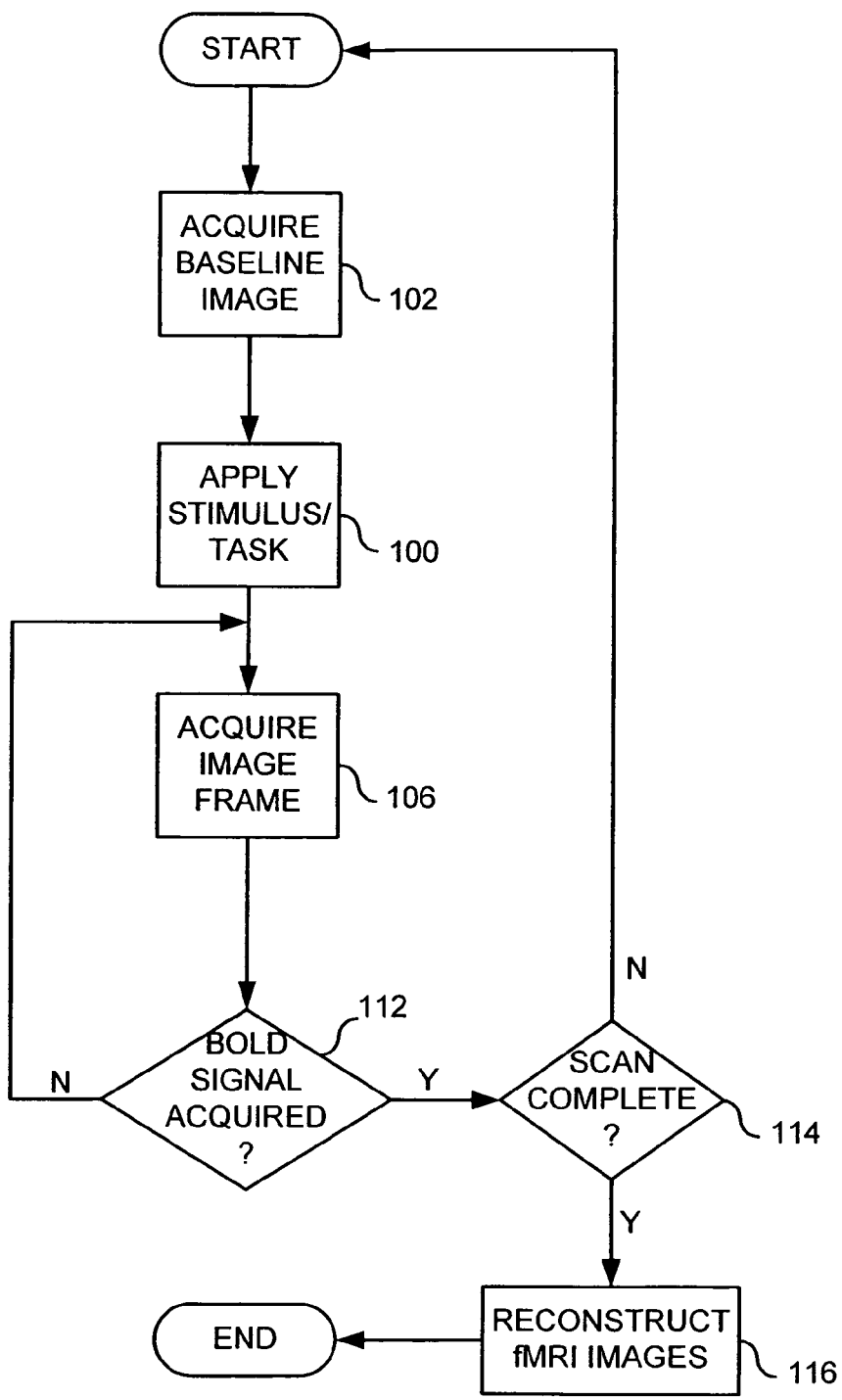
FIG. 9 is a flow chart of the steps employed in the preferred embodiment of the fMRI scan according to the present invention.
Figure 10:
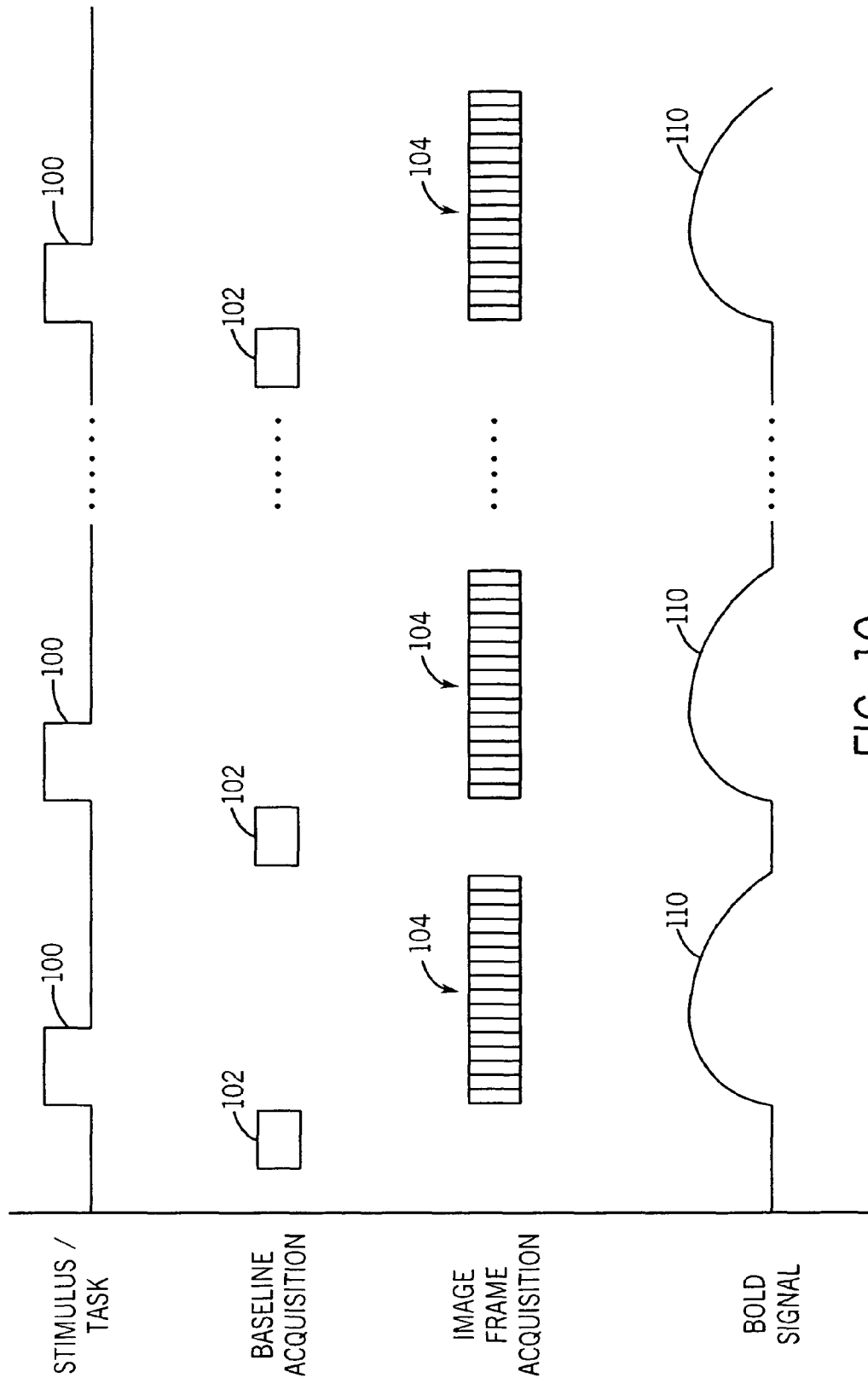
FIG. 10 is a pictorial representation of the scan according to the method of FIG. 9.

An fMRI study is performed by intermittently stimulating the subject of the examination or asking the subject to intermittently perform a task while MRI data is acquired from the subject's brain. For example, the subject might be stimulated with a visual pattern or asked to tap a finger. Such a functional paradigm is shown in FIG. 10, where the stimulus or task occurs at intervals indicated at 100. Referring particularly to FIGS. 9 and 10, before the start of each stimulus or task 100 a baseline acquisition is performed with the MRI system using the above-described pulse sequence as indicated at process block 102. This is a fully sampled acquisition in which a 256×265 pixel image is acquired with 100 different projection views for each phase encoded slice.

The stimulus is then applied or the task started as indicated at process block 100 and a series of image frames are acquired as indicated at 104. More specifically, a highly under-sampled image frame is quickly acquired at process block 106 in which only 10 projection views are acquired for each phase encoded slice. Although few in number, the acquired projection views are evenly distributed to sample k-space as uniformly as possible in each slice. A succession of such under-sampled image frames are acquired as rapidly as possible until the BOLD signal response indicated at 110 in FIG. 10 is finished. In the preferred embodiment this is a 5 second time period as determined at decision block 112, and during this time period 20 image frames are acquired in a succession of 20 time intervals as the BOLD signal 110 rises to a peak value and falls back to the baseline value.

Figure 11:
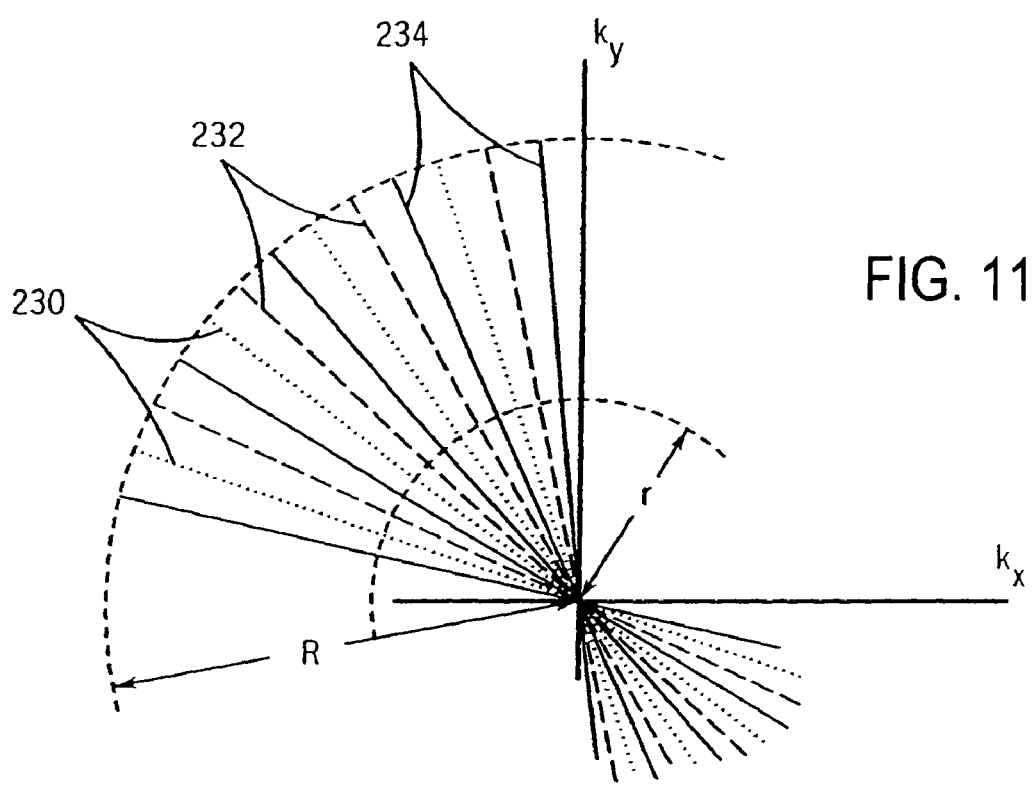
FIG. 11 is a pictorial representation of interleaved projection views used in the method of FIG. 9.

An important feature of these acquired image frames is that the projection views in each image frame are interleaved with each other. This interleaving is illustrated in FIG. 11 where dotted lines 230 indicate the k-space sampling of the projection views acquired during one image frame acquisition, dashed lines 232 indicate the projection views acquired in the next image frame and the lines 234 indicate projection views acquired in a third image frame. Whereas any one of the acquired image frames may fully sample k-space out to a radius r from the center of k-space, the three sets of interleaved projection views sample k-space out to a larger radius R. The 20 sets of interleaved projection views acquired after each stimulation/task period 100 fully samples k-space to an even larger radius.

This sequence of acquiring a well-sampled baseline image 102, followed by application of the stimulus/task 100 and acquisition of image frames 104 is repeated until the scan is completed as determined at decision block 114. The scan continues for as long as desired, and as will be discussed below, the data acquired during each repetition is averaged to increase the SNR of the final images. Following the scan the fMRI images are reconstructed as indicated at process block 116.

Figure 12:
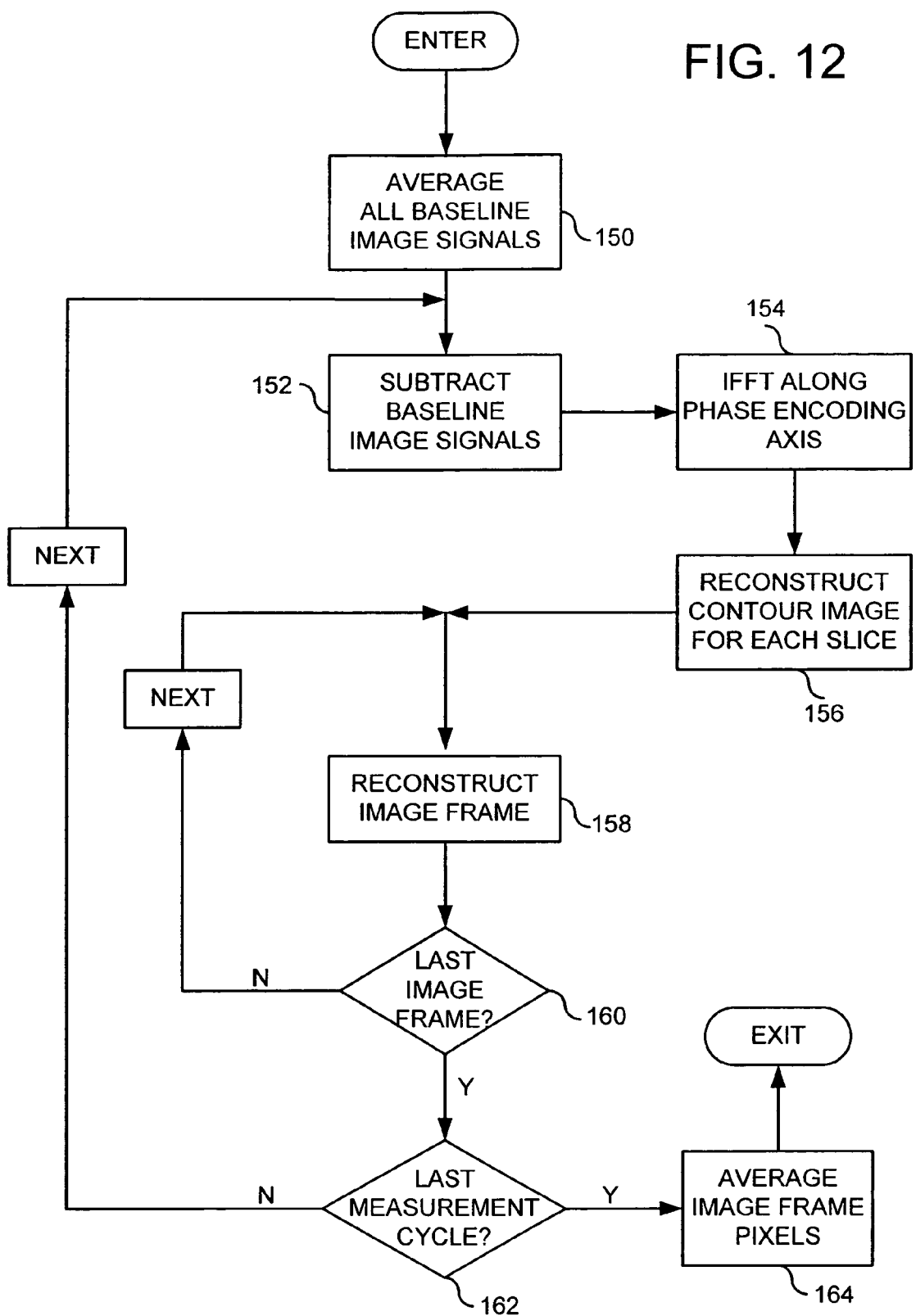
FIG. 12 is a flow chart of the fMRI image reconstruction process that forms part of the method of FIG. 9.

Reconstruction of the fMRI images employs the present invention to improve the image frames reconstructed from the highly under-sampled set of k-space projection views. Referring particularly to FIG. 12, the first step in the image reconstruction process 116 is to average all the corresponding phase encoded projection views in the acquired baseline images as indicated at process block 150. As discussed above, any number of such baseline images may be acquired during the scan and the corresponding k-space samples in each are averaged to improve SNR of the non-active, baseline brain image.

A loop is then entered in which the image frames are reconstructed for each measurement cycle. As indicated at process block 152, the baseline image signals are first subtracted from the image frame projection views. This produces a sparse data set in which the BOLD signals are present but stationary structures and tissues are subtracted out. It is accomplished by subtracting from each of the 10 phase encoded projection views in each of the acquired image frames the corresponding k-space signal samples in the corresponding phase encoded projection views of the baseline image. An inverse fast Fourier transform (IFFT) is then performed on each resulting image frame along its phase encoding axis at process block 154 to produce five discrete slices with 10 k-space projection views in each slice. As indicated at process block 156, a composite image is reconstructed for each of these five slices. As indicated above, the projection views acquired at each slice 204-208 during the measurement cycle are interleaved with each other so that when they are combined into a single k-space data set, a highly sampled data set is formed. A composite image for each slice is produced by using a conventional image reconstruction technique. This may be a filtered backprojection of the combined, Fourier transformed composite image projection views, or the combined projection views may be regridded to a Cartesian grid followed by a conventional 2DFT image reconstruction.

Referring still to FIG. 12, armed with a quality composite image for each image frame slice, a loop is entered in which the slices in each image frame are reconstructed as indicated at process block 158. This highly constrained backprojection process will be described in detail below with reference to FIG. 13, and when the last image frame in the current measurement cycle has been reconstructed as determined at decision block 160, the system loops back at decision block 162 to repeat the image frame reconstruction process using data acquired in the next measurement cycle. When all the acquired data has been processed, the corresponding pixel values in the corresponding image frames of successive measurement cycles are averaged at process block 164 to produce a single set of higher quality image frames that depict the increase in BOLD signal at locations in the subject's brain during a time interval following the application of a stimulus or beginning of a task.

Figure 5:
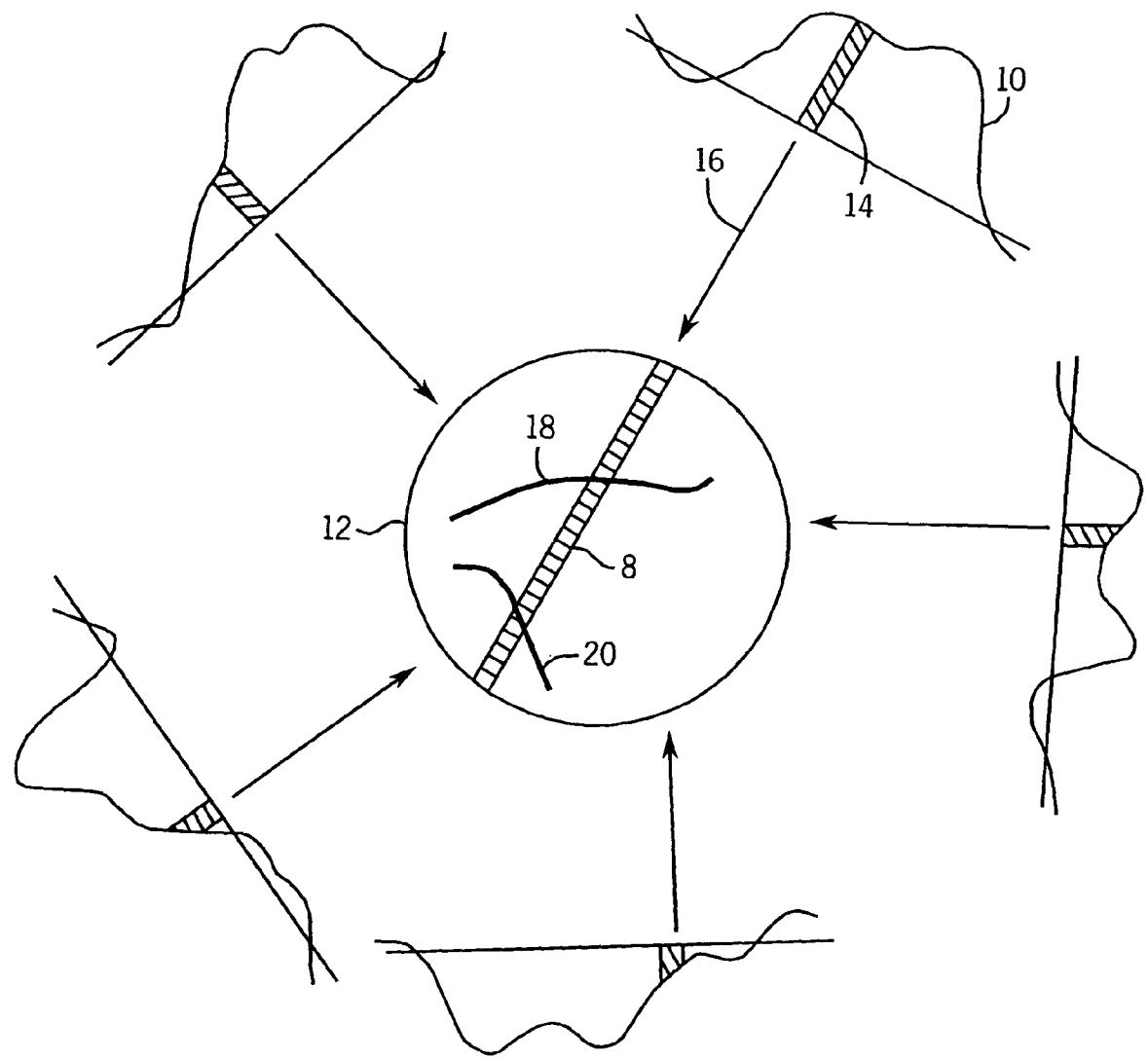
FIG. 5 is a pictorial representation of the highly constrained backprojection method according to the present invention for a 2D PR image reconstruction.
Figure 6:
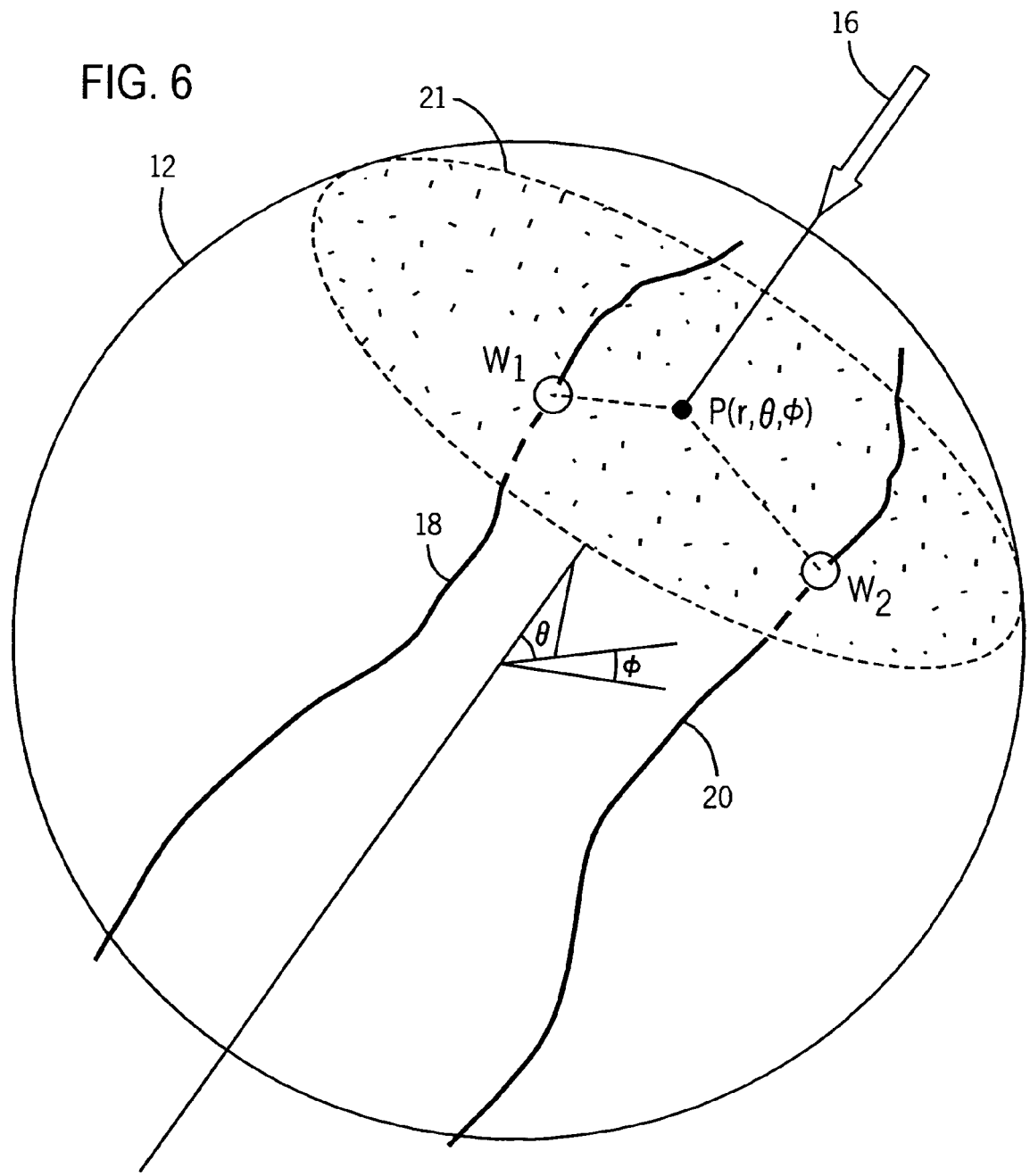
FIG. 6 is a pictorial representation of the highly constrained backprojection method for a 3DPR image reconstruction.
Figure 13:
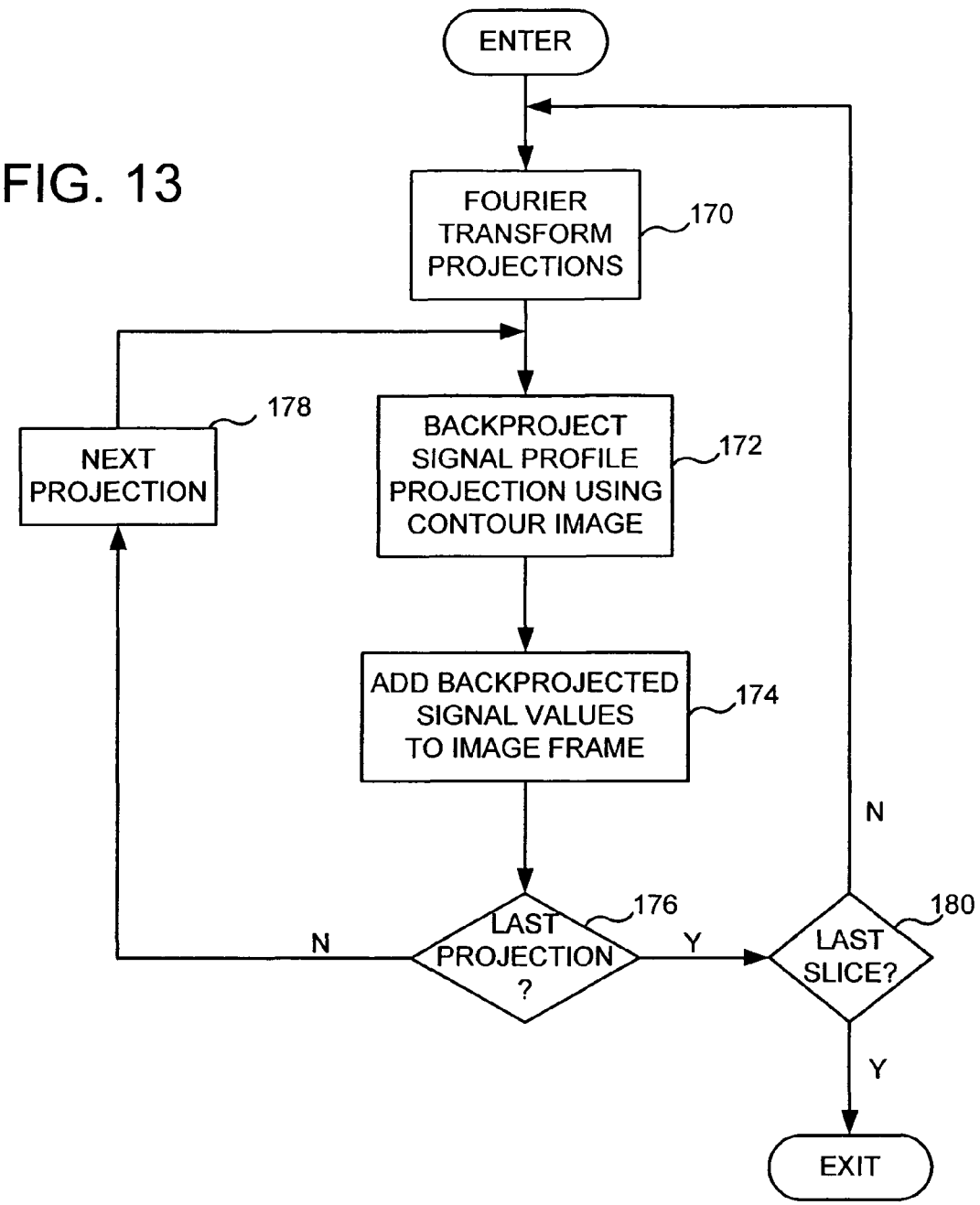
FIG. 13 is a flow chart of the image frame reconstruction process that forms part of the process of FIG. 12.

Referring particularly to FIG. 13, the 2D image slices in each image frame of a measurement cycle are reconstructed using the corresponding slice composite images for that measurement cycle. The first step is to transform the image frame k-space projections (10 in the preferred embodiment) to radon space by Fourier transforming them as indicated at process block 170. The result is a set of signal profiles 10 as depicted in FIG. 5. As indicated at process block 172, each of these signal profiles is then backprojected into the VOI as depicted by path 8 in FIG. 5. This backprojection is weighted by the composite image as described above with reference to equation (2). That is, the normalized backprojection value $(P/P_c)$ at any pixel (n) is weighted by the magnitude $(C_n)$ of the same pixel in the composite image.

As indicated at process block 174, the backprojected signal values $(S_n)$ are then added to an image frame that is being reconstructed. The system then loops back at decision block 176 to backproject the next signal profile 10 as indicated at process blocks 178 and 172. The signal values $(S_n)$ of all the highly constrained backprojected signal profiles 10 are, therefore, added to the image frame with a weighting determined by corresponding pixel values in the higher quality composite image. The composite image is higher in quality because it is reconstructed from far more projection views and this results in fewer artifacts. The composite image is also higher quality because the projection views used to reconstruct it are acquired over a much longer time span. Generally, the SNR of an image frame is proportional to the square root of its acquisition duration. It is a discovery of this invention that the higher quality of the composite image is conveyed to the image frame through this unique highly constrained reconstruction process.

Each slice 204-208 in the current image frame is reconstructed in this manner using the corresponding composite slice image until all the slices are reconstructed as determined at decision block 180.

Each frame image in the preferred embodiment is acquired as a 3D k-space data set of phase encoded projection views. There are a number of other ways to reconstruct the frame image from this 3D data set using the composite image. A number of such alternative methods are described in co-pending U.S. Pat. Appln. Ser. No. 60/719,554 filed on Sep. 22, 2005 and entitled "Highly Constrained Image Reconstruction Method".

The invention claimed is:

1. A method for producing an image of a subject's brain positioned in a field of view (FOV) of a magnetic resonance imaging (MRI) system, the steps comprising:
   a) acquiring with the MRI system a set of projection views at each of a plurality of intervals following an event that produces brain activity in the subject;
   b) producing a composite image with projection views acquired during the plurality intervals wherein the projection views are interleaved with each other;
   c) reconstructing an image frame at each interval by:
   c)i) backprojecting a set of projection views acquired at the interval into the FOV and weighting the value backprojected into each image pixel by the value of the corresponding pixel in the composite image; and
   c)ii) summing the backprojected values for each image pixel.

2. The method as recited in claim 1 in which each image pixel backprojected value $S_n$ is calculated in step c)i) as $$S_n = (P \times C_n) \Big/ \sum_{n=1}^{N} C_n$$

where:
- P=the projection view value being backprojected;
- $C_n$=corresponding pixel value in the composite image;
- $S_n$=the value of the $n^{th}$ pixel along the backprojecting path; and
- N=total number of pixels along the backprojection path.

3. The method as recited in claim 1 which includes:
d) acquiring a baseline image comprised of projection views acquired during a time period in which the event is not producing brain activity; and
e) subtracting the baseline image projection views from corresponding projection views acquired in step a) prior to performing steps b) and c).

4. The method as recited in claim 1 in which step c) includes Fourier transforming each projection view prior to backprojecting the view.

5. The method as recited in claim 1 in which step a) is performed under the direction of a hybrid 2D PR pulse sequence and each set of projection views is comprised of a plurality of subsets of projection views that depict a corresponding plurality of slices of the subject.

6. The method as recited in claim 5 in which step b) includes producing a composite image for each of said plurality of slices.

7. The method as recited in claim 6 in which step c) includes reconstructing an image of the subject at each slice using the composite image corresponding to the slice.

8. The method as recited in claim 1 in which steps a), b) and c) are repeated and the method further includes:
d) averaging the reconstructed image frames at each interval.

9. A method for producing an image of a subject positioned in a field of view (FOV of a magnetic resonance imaging (MRI) system, the steps comprising:
a) acquiring with the MRI system a set of views of the subject's brain at a plurality of intervals following an event that produces brain activity;
b) reconstructing a composite image with projection views acquired at a plurality of intervals in step a), wherein said projection views used to form the composite image are interleaved; and
c) reconstructing an image frame at each interval by:
c)i) producing an image data set from projection views acquired in step a) during the interval; and
c)ii) producing an image frame of the subject's brain using the image data set and weighting each image pixel location by the corresponding pixel value in the composite image.

10. The method as recited in claim 9 in which step a) includes acquiring a plurality of phase encoded projection views during each interval, step b) includes reconstructing a composite image for each phase encoding, and the composite images are used in step c) to reconstruct said image frames of the subject.

11. The method as recited in claim 9 in which step c)ii) includes backprojecting the projection views in the image data set into the FOV and weighting the value backprojected into each image pixel by the value of the corresponding pixel in the composite image.

12. The method as recited in claim 11 in which the projection views in the image data set are normalized by corresponding projection views of the composite image.

* * * * *